(12) United States Patent
deBlanc et al.

(10) Patent No.: US 8,208,778 B2
(45) Date of Patent: Jun. 26, 2012

(54) PLANAR LAYER WITH OPTICAL PATH

(75) Inventors: James J. deBlanc, Roseville, CA (US);
Andrew Michael Cherniski, Rescue, CA (US); Herbert J. Tanzer, Woodland Park, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/946,804

(22) Filed: Nov. 15, 2010

(65) Prior Publication Data

US 2011/0056075 A1 Mar. 10, 2011

Related U.S. Application Data

(63) Continuation of application No. 10/646,572, filed on Aug. 23, 2003, now abandoned.

(51) Int. Cl.
G02B 6/26 (2006.01)
G02B 6/35 (2006.01)
(52) U.S. Cl. .............................. 385/132; 385/50; 65/386

(58) Field of Classification Search ...................... 65/386
See application file for complete search history.

(56) References Cited

U.S. PATENT DOCUMENTS

| | | | |
|---|---|---|---|
| 5,432,873 A * | 7/1995 | Hosoya et al. ............... 385/21 |
| 6,624,077 B2 * | 9/2003 | White ........................ 438/692 |
| 6,693,736 B1 * | 2/2004 | Yoshimura et al. ......... 359/333 |
| 2001/0026670 A1 * | 10/2001 | Takizawa et al. ............ 385/129 |
| 2003/0118310 A1 * | 6/2003 | Steinberg et al. ............ 385/132 |

* cited by examiner

Primary Examiner — Jerry Rahll

(57) ABSTRACT

A channel is created within a planar layer. At least a portion of an optical path is formed within the channel. An optical core medium may be deposited into the channel. In various embodiments, reflective layers are deposited within and over the channel to form the optical path. In another embodiment, a photosensitive sheet is exposed to an optical path mask in the presence of an optical source to define an optical path lying within the plane of the sheet.

19 Claims, 13 Drawing Sheets

PLANAR LAYER WITH OPTICAL PATH

CROSS REFERENCE TO RELATED APPLICATIONS

This application is a continuation application of U.S. patent application having Ser. No. 10/646,572 and filed Aug. 23, 2003, now abandoned which is incorporated herein by reference.

FIELD OF THE INVENTION

This invention relates to the field of communications. In particular, this invention is drawn to optical communications and methods of forming optical paths within planar layers.

BACKGROUND OF THE INVENTION

Computer systems typically include components such as processors, power supplies, nonvolatile storage, peripheral devices, etc. The components require power and some way to communicate with each other. These components frequently reside on one or more printed circuit boards that provide both mechanical support and electrical connectivity as a result of electrically conductive traces on the board.

The boards are architected to maintain the signal amplitude and switching rise time for signals communicated on the electrical traces. As the frequency of communication increases, circuit board losses tend to degrade the quality of the signals.

Signal repeaters may be incorporated in the architecture to maintain the signal amplitude and rise time. Adding signal repeaters between components, however, increases cost and complexity of the printed circuit board.

Differential signaling may be used to extend the useful frequency of operation of the board. Differential signaling, however, requires dual traces with matched impedances for every signal path.

High-speed traces tend to be sources of electromagnetic interference (EMI) that may require costly shielding. Moreover, losses such as dielectric losses and skin effect increase with frequency and place an upper bound on the useful electrical operating frequency of the printed circuit board.

SUMMARY OF THE INVENTION

In view of limitations of known systems and methods, various methods for forming an optical communication path are described. In one embodiment, a channel is created within a planar layer. At least a portion of the optical path is formed within the channel. In another embodiment, a photosensitive sheet is exposed to an optical path mask in the presence of an optical source to define an optical path lying within the plane of the sheet.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
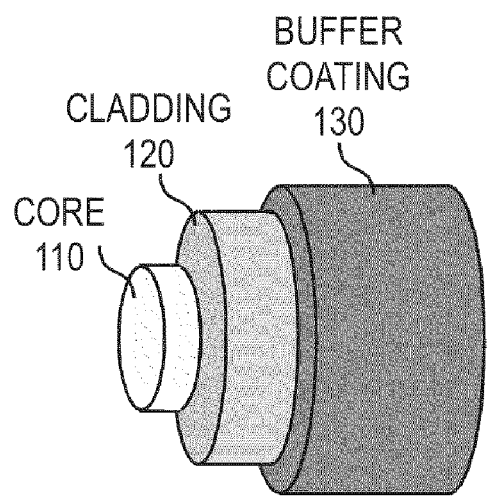
FIG. 1 illustrates one embodiment of an optical fiber.
Figure 1:
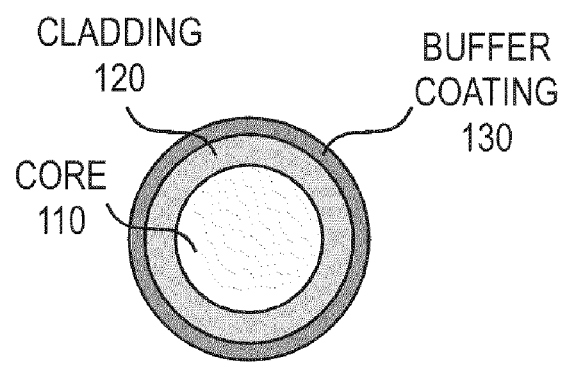

FIG. 1 illustrates one embodiment of an optical fiber for communicating optical signals. Fiber 100 includes a cylindrical core 110 for carrying an optical signal. A cylindrical cladding 120 that ensures light from the core is reflected back into the core surrounds the core. A buffer coating 130 surrounding the cladding and core serves to protect the fiber from damage and moisture. Typically, a number of optical fibers are placed in a jacketed bundle.

The optical fiber is a conduit for light. The refractive index ($r_1$) of the core is greater than that of the cladding ($r_2$) so that light traveling within the core is reflected back into the core through a principle known as total internal reflection. The core is thus the medium through which an optical signal propagates.

Signals communicated through the fiber are subject to losses such as dispersion that limit the length of fiber that may be used before signal repeaters are required. The rate of signal degradation is related to the wavelength of light used for the optical communication and the materials used for the fiber.

Figure 2:
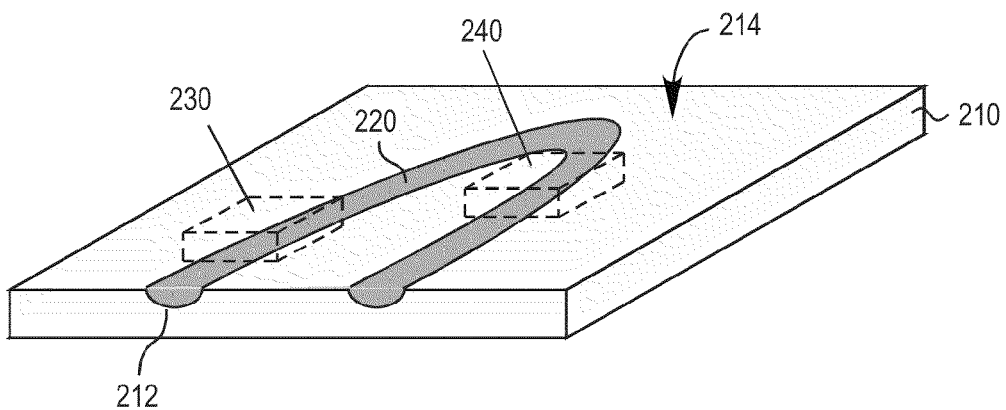
FIG. 2 illustrates one embodiment of a planar layer with an optical path formed within the layer.

FIG. 2 illustrates one embodiment of an optical path 220. At least a portion of the optical path 220 is disposed within planar layer 210. The optical path is formed within channel 212. The channel extends from one face 214 of the board into the interior of the board. The optical path may be used for communication between devices 230 and 240. Planar layer serves to provide mechanical support as well as interconnectivity between components for optical communication as a result of the optical path 220.

Figure 3:
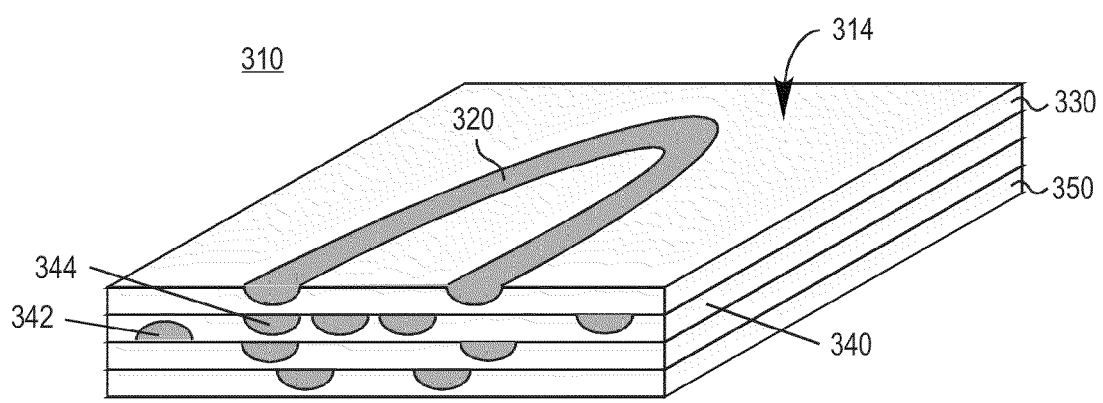
FIG. 3 illustrates one embodiment of a board comprising a plurality of optical paths disposed within distinct planar layers.

FIG. 3 illustrates a plurality of optical paths disposed within distinct layers 330-350 of a multilayer board 310. Optical path 320, for example, is disposed within a face 314 of a layer 330. In particular, optical path 320 is disposed within a channel extending from a face 314 of the layer into the interior of the layer 330. Layer 340 has an optical path 342, 344 on each face of the layer.

An optical signal traveling a non-cylindrical optical path may tend to degrade at a higher rate than optical signals traveling a cylindrical optical fiber. Despite a higher degradation rate, however, the non-cylindrical optical path may be suitable for short distances such as across a printed circuit board or across an integrated circuit die.

Various approaches for creating an optical path within a channeled planar layer are described. Depending upon the requirements for the optical path and the choice of construction, either the optical core or cladding may be omitted if the optical signal levels are sufficient along the path for the application despite the higher losses incurred. Techniques for creating the channel in the planar layer include molding the planar layer with the channel or removing material from the planar layer. Removal may be accomplished any number of ways including chemically (etching), mechanically (e.g., cutting), and sublimation or vaporization (e.g., by laser cutting).

Figure 4:
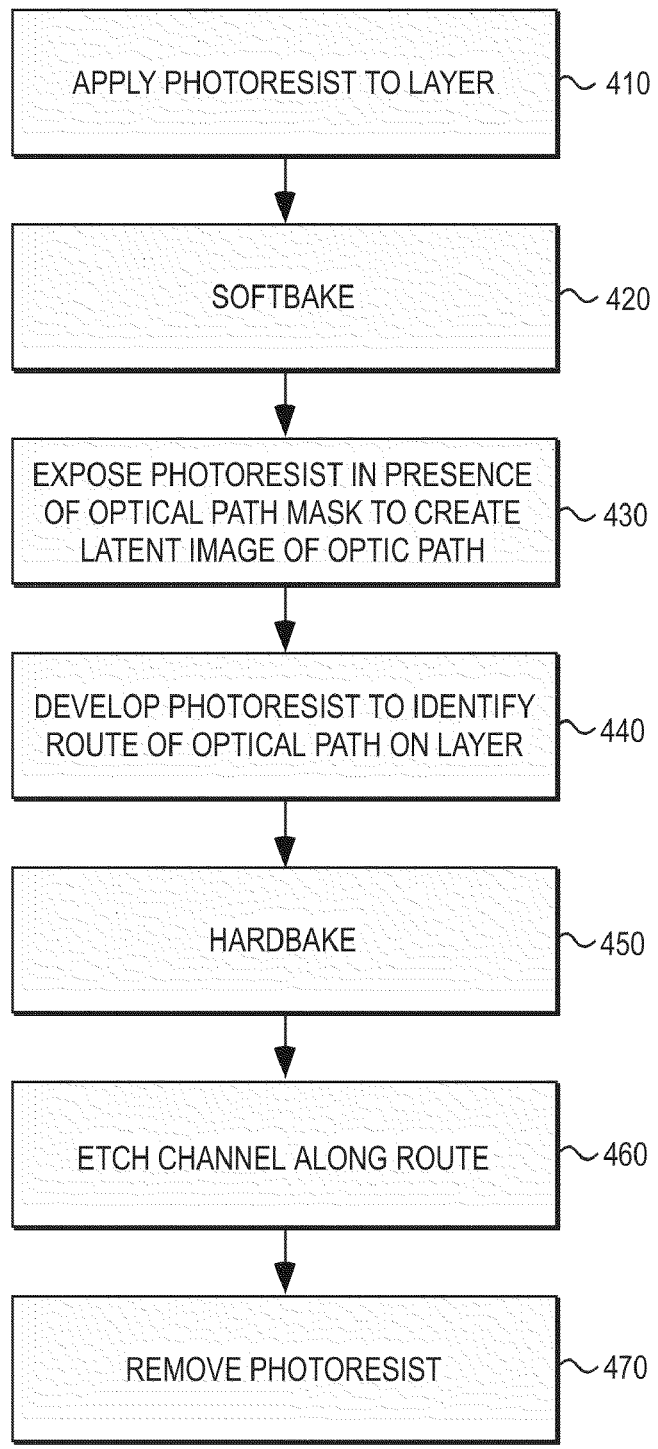
FIG. 4 illustrates one embodiment of a method of lithographically defining the location of an optical path on a planar layer.

FIG. 4 illustrates one embodiment of a method for lithographically defining the location of the optical path. A photoresist is applied to a planar layer in step 410. The planar layer may consist of any of a number of materials including ceramic, metal, plastic, semiconductor substrate, or a fibrous material such as an epoxy impregnated cloth suitable for use as a printed circuit board. A softbake step 420 may be required to eliminate excess solvents and ensure that the photoresist adheres to the planar layer.

The planar layer is exposed in the presence of an optical path mask in step 430 to define a latent image of the optical path within the photoresist. The optical path mask includes portions that permit light to pass through the mask and portions that block the passing of light. The optical path mask defines the route of the optical path carried by the planar layer. The optical path mask may be a negative or a positive mask.

The latent image is developed in step 440. A hardbake step may be required in step 450 to ensure that the developed photoresist withstands the subsequent etching process. The planar layer is etched to create a channel as defined by the latent image in step 460. The channel extends from one face of the planar layer into the interior of the planar layer. The photoresist is removed in step 470, if necessary.

Figure 5:
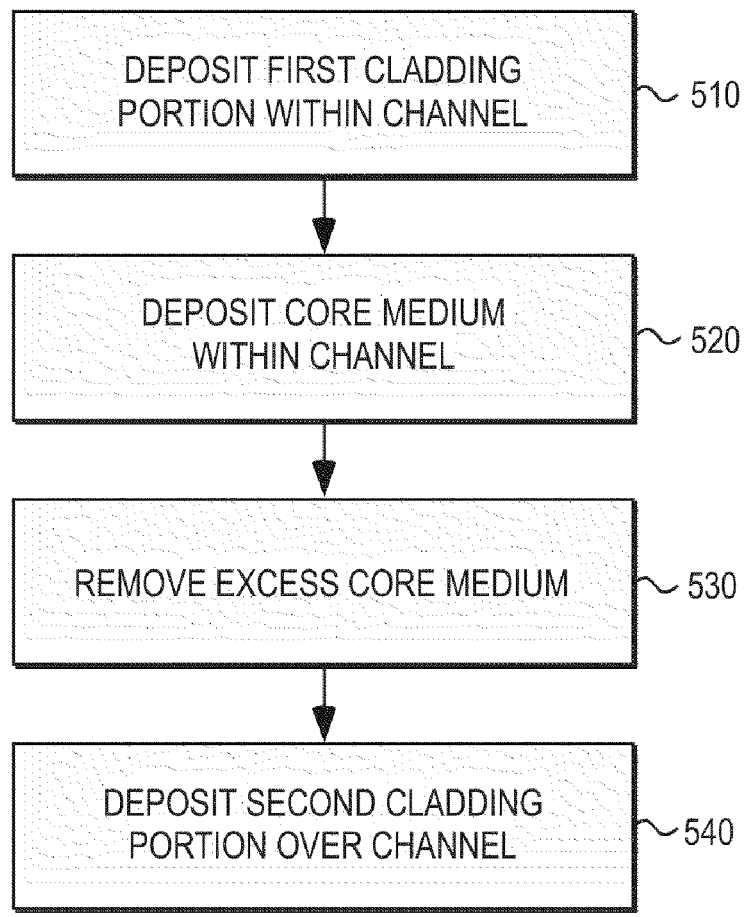
FIG. 5 illustrates one embodiment of a method of filling an optical path with optical core material.

FIG. 5 illustrates one embodiment of a process for filling the channel with an optical core. A first cladding layer portion is deposited into the channel in step 510. The optical core layer is deposited within the channel in step 520. In one embodiment, the optical core is either liquid or semi-solid to enable pouring or pressing the optical core into the channel. Excess core material is scraped off of the planar layer in step 530, if necessary. A second cladding layer portion is deposited over the optical core in step 540.

The optical core material should be composed of a material that is sufficiently transparent at the desired optical wavelength to serve as a conduit for the optical signal.

Figure 6:
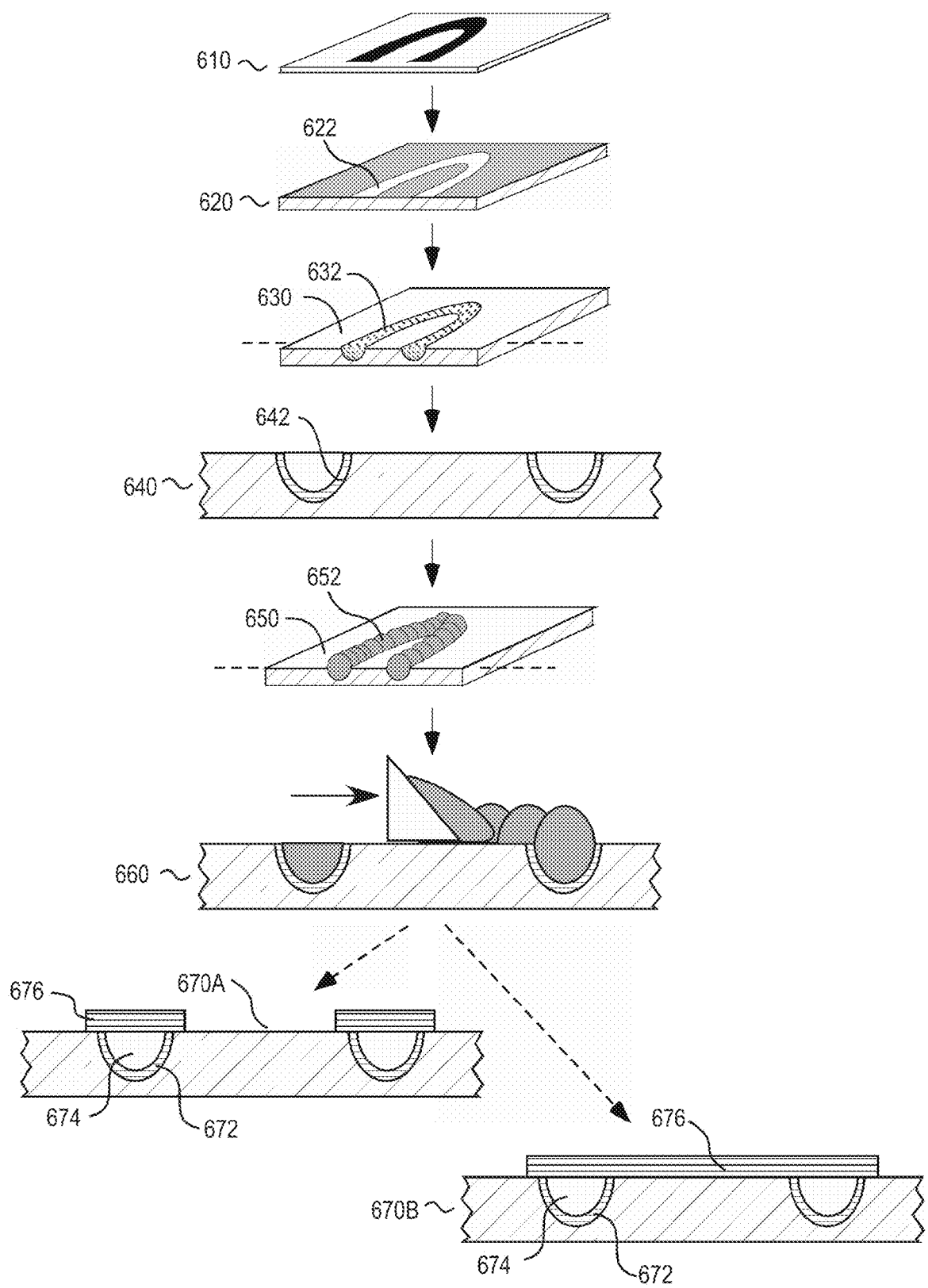
FIG. 6 illustrates a planar board at various points during formation of an optical path in the board.

FIG. 6 illustrates a planar board at various stages of forming an optical path within the board. Optical path mask 610 is positioned over the planar layer to create a latent image of the desired path within the photoresist. After development, the photoresist will clearly define the route 622 of the optical path as illustrated with planar layer 620. After etching, the planar layer 630 will have channel 632 as defined by the optical path mask 610.

A first cladding portion 642 may be deposited within the channel as illustrated with planar layer cross-section 640. An optical core medium 652 may be deposited within the channel as illustrated with planar layer 650. If necessary, excess optical core medium may be removed, for example, by scraping as illustrated with planar layer cross-section 660.

A second cladding portion may be deposited over the channel. In one embodiment, the second cladding portion 676 is deposited substantially only over the channel as illustrated with planar layer cross-section 670A. In an alternative embodiment, the second cladding portion 676 may be deposited over an area substantially beyond the channel as indicated in planar layer 670B. The optical core medium 674 (if present) is sufficiently transparent at the optical wavelength used for optical signal communication to enable optical communication along the path.

The optical path need only comprise the components necessary to communicate the optical signal. In one embodiment, the optical path includes an optical core medium 674 and at least one of the first and second cladding portions 672 or 676. For short distances, first and second cladding portions 672, 676 may not be required. Thus in one embodiment, the optical path includes an optical core medium 674 and no cladding portions 672 or 676.

In some cases, reflectivity of the first and second cladding portions 672 and 676 may be capable of maintaining the optical signal over the required distance in the absence of an optical core medium 674. A void 674 in lieu of an optical core medium may make the manufacture of the optical path associated with planar layer 670A more difficult than the manufacture of planar layer 670B because of the limited structural support for the second cladding portion 676. Manufacturing the planar layer 670B may be easier particularly if second cladding layer 676 is deposited or applied as a film.

As illustrated in FIG. 2, a plurality of planar layer may be combined to form a multi-layer board having a plurality of optical paths disposed within distinct layers. Coupling an optical path on one layer with an optical path in another layer may be desirable for the routing of optical signals.

Figure 7:
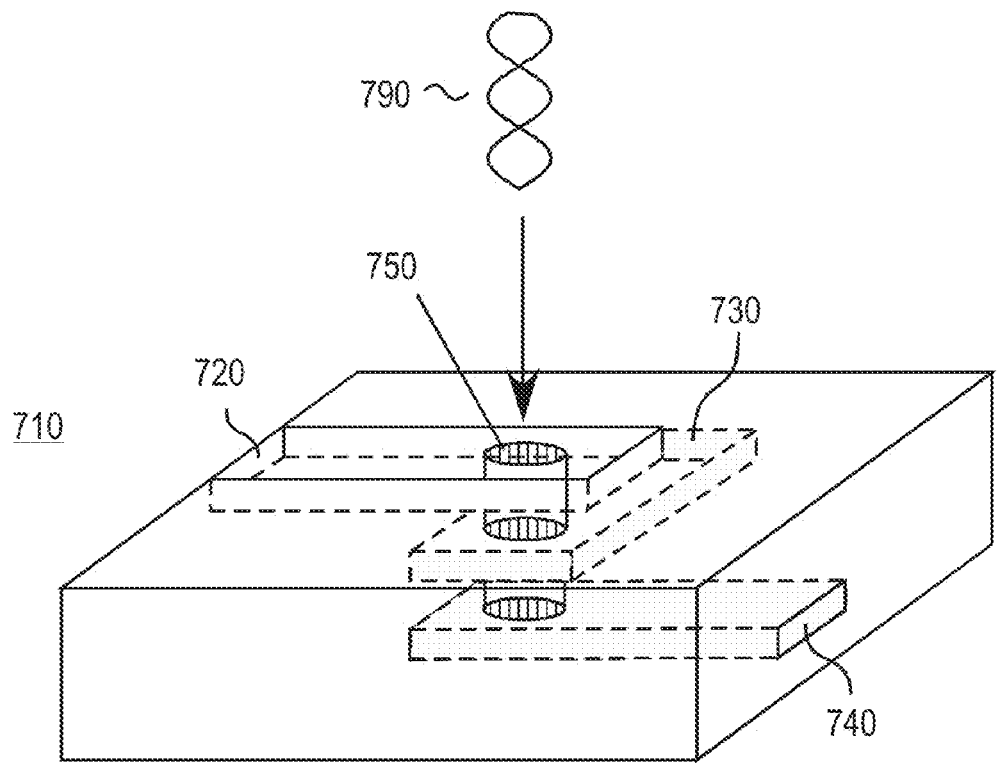
FIG. 7 illustrates one embodiment of a via and a via insert connecting a plurality of optical paths disposed within distinct planar layers.

FIG. 7 illustrates a board 710 having a plurality of optical paths 720, 730, 740 disposed substantially within distinct planes or layers of the board. In order to optically couple the paths, a via 750 is created. Via 750 is effectively a hole or tunnel connecting the optical paths to be coupled. In one embodiment, via 750 is filled with optical core medium to facilitate communication of an optical signal within the via. The via thus acts as a transmission bridge between optical paths.

In one embodiment, a via insert 790 is provided to re-direct optical signals from one optical path to another. In the illustrated embodiment, via insert 790 is a helical reflective insert.

Figure 8:
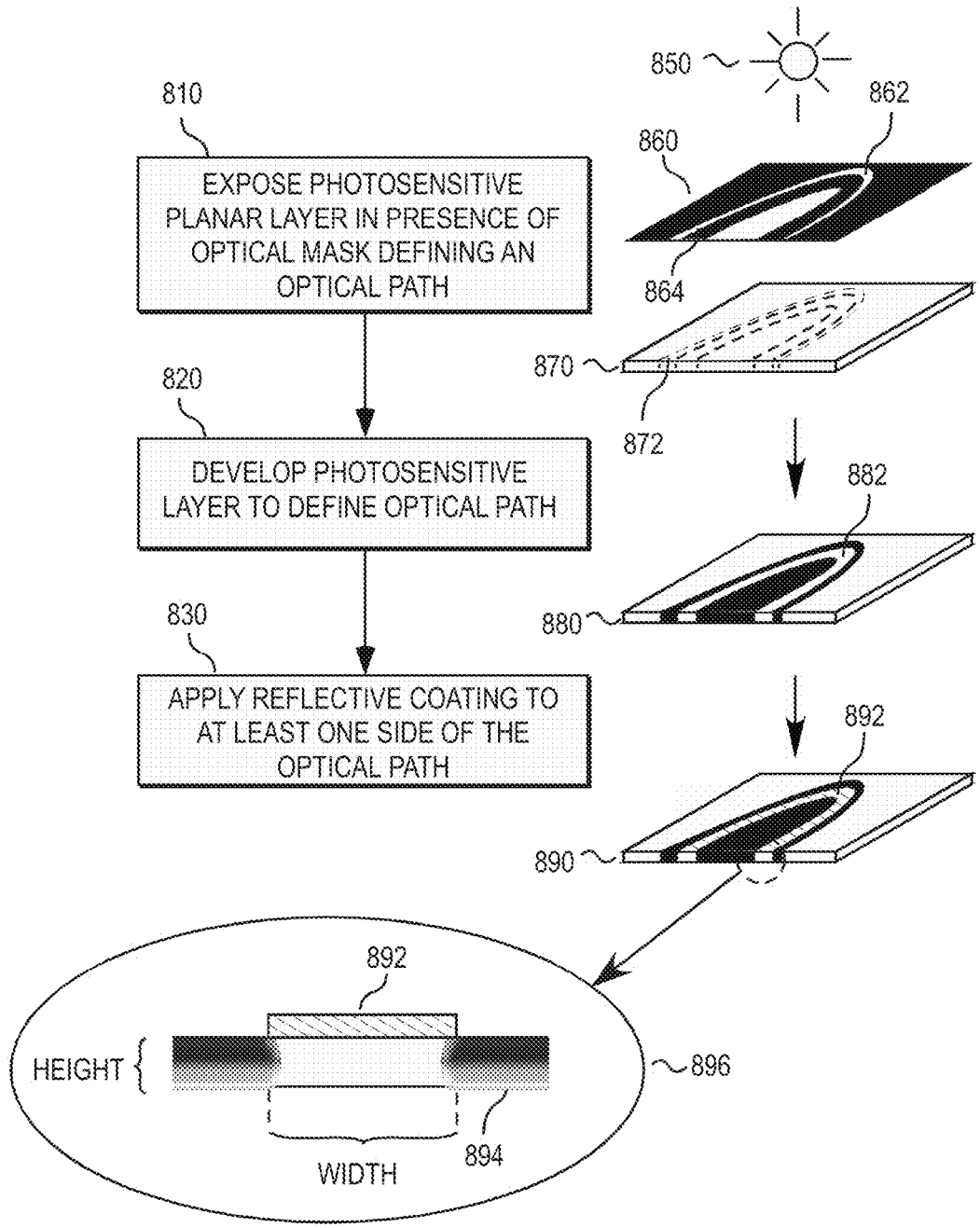
FIG. 8 illustrates one embodiment of an alternative method of forming an optical path using a photosensitive planar layer.

FIG. 8 illustrates an alternative method of forming an optical path within a planar layer. In step 810, a photosensitive planar layer 870 is exposed to a source 850 in the presence of an optical mask 860. The optical mask includes contrasting regions 862, 864 that collectively define an optical path. Exposure creates a latent image 872 of the optical path on the planar layer 870.

The photosensitive layer is developed in step 820 to define the optical path within the layer. After development, the resulting planar layer 880 includes contrasting regions (dark and light) that collectively define the optical path 882 within the planar layer.

A reflective coating may be applied to the exposed faces of the optical path as indicated in step 830. Reflective layer 892 may be substantially limited to covering only the optical path as illustrated. Alternatively, the reflective layer may extend substantially beyond the area of the optical path to cover, for example, one face of the planar layer 890. Another reflective layer may be similarly disposed on an opposing face of the planar layer. For structural support, the planar layer may require lamination between planar layers of structural supporting material.

The transition between the light and dark areas of the optical path may not be as well defined as suggested by the mask. In particular, the "dark" regions may not have the same level of opaqueness through the planar layer as indicated by sample dark region 840. In addition, the transition 894 may be graduated vertically or horizontally rather than being abrupt. A low height-to-width aspect ratio wherein the height is substantially less than the width (i.e., height<<width) may be required to improve the consistency of opaqueness.

Figure 9:
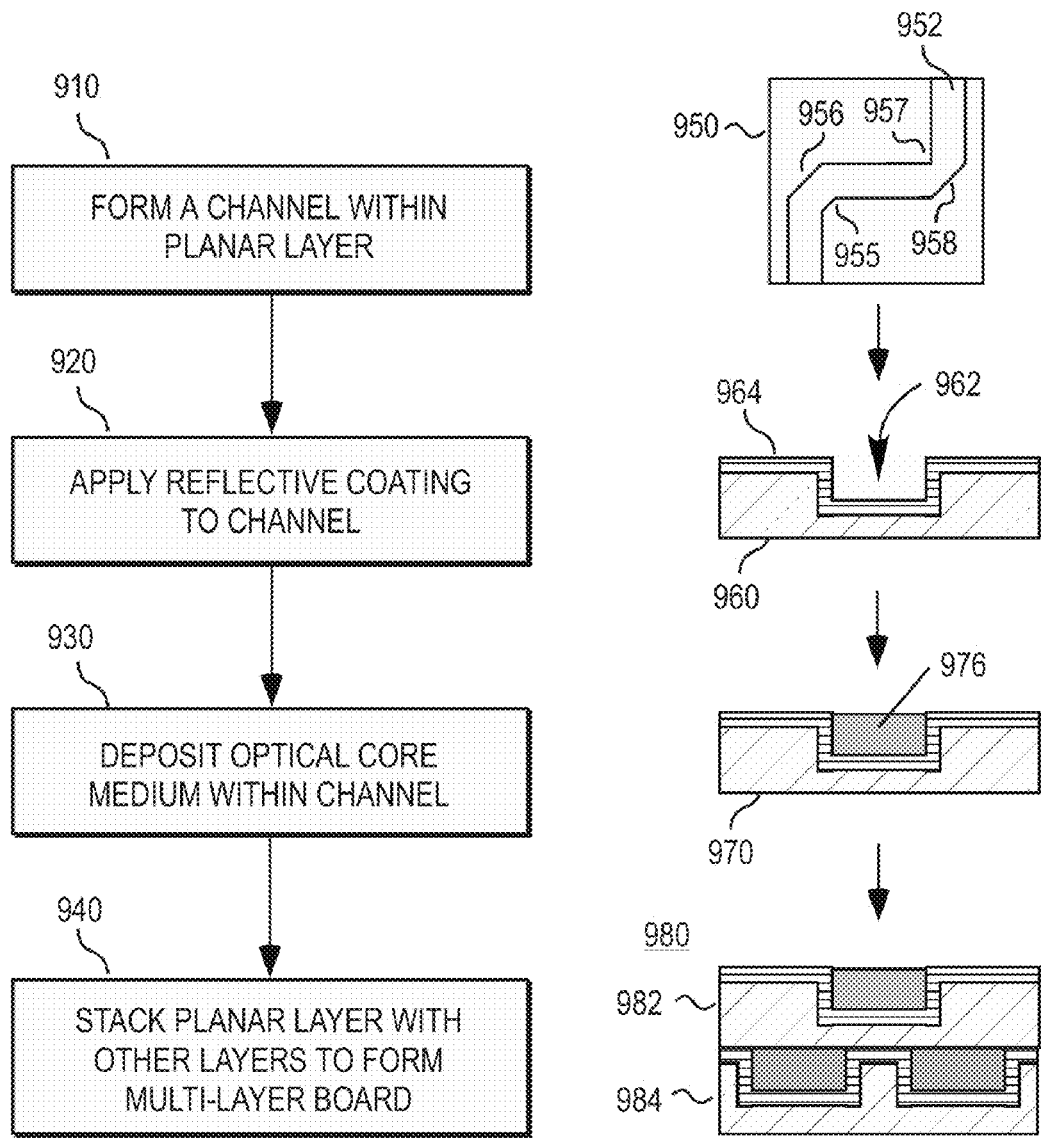
FIG. 9 illustrates another embodiment of a method of forming an optical path within a planar layer.

FIG. 9 illustrates an alternative method of forming an optical path within a planar layer. A channel is formed in the planar layer using tooled routing in step 910. The channel is thus formed through machining. Changes in direction of the path are made using 45° angles as indicated by path 952 in planar layer 950. In one embodiment, the outside turn 958 is a 45° turn but the inside turn 957 is not. In an alternative embodiment, both the inside 955 and outside 956 turns are 45° turns.

A reflective layer 964 is deposited within the channel 962 in step 920 as illustrated with respect to planar layer 960. The channel may be filled with an optical communication medium 976 in step 930 as illustrated with respect to planar layer 970. The planar layer 982 may then be stacked with other layers 984 to form a multi-layer board 980 in step 940. If the channel is not filled with an optical communication medium, the optical path terminations at the edges of the planar layer may be sealed off with an optical communication medium to provide a contamination seal.

Figure 10:
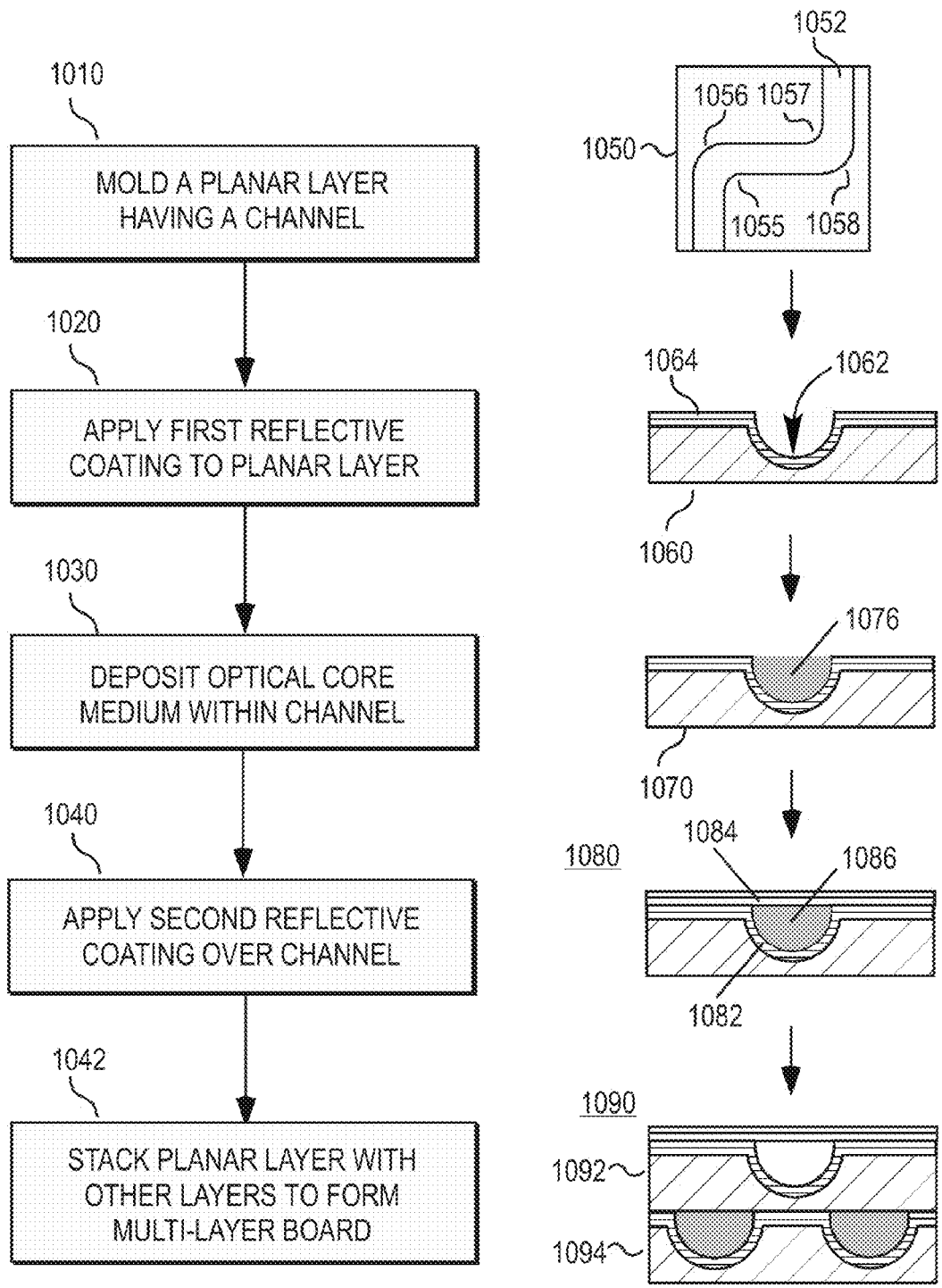
FIG. 10 illustrates a method of forming an optical path with a molded planar layer and reflective layers.

FIG. 10 illustrates an alternative method of forming an optical path within a planar layer. A channel having a semicircular cross-section is formed within a planar layer through a molding process in step 1010. In various embodiments, the molding process may be an injection molding or a vacuum form film molding process.

A first reflective coating 1064 is applied to the planar layer 1060 including the channel 1062 in step 1020. The application of the first reflective coating or mirroring may be accomplished, for example, using conventional vacuum metal deposition processes.

In one embodiment, an optical core medium 1076 is deposited into the channel of the planar layer 1070 in step 1030. The face of the planar layer 1080 having the channel is capped with a second reflective coating 1084 or film in step 1040. In the illustrated embodiment, the first 1082 and second 1084 coatings form a reflective cladding that surrounds the optical core medium 1086. In various embodiments, the optical core medium or one of the reflective coatings is omitted.

The planar layer may be stacked in step 1042 to form an optical board 1090 having a plurality of optical paths lying in substantially distinct planes or layers. Optical board 1090 illustrates a planar layer 1094 having an optical path comprising an optical core medium and only one reflective coating such that the optical core medium is not surrounded by reflective material. Optical board 1090 also illustrates a planar layer 1092 having an optical path comprising reflective layers without an optical core medium such that the channel void is surrounded by reflective material. Coupling between paths lying in distinct layers may be accomplished with vias and reflective inserts. In one embodiment, an edge-terminated channel is flared to support better optical coupling with an edge connector.

Figure 11:
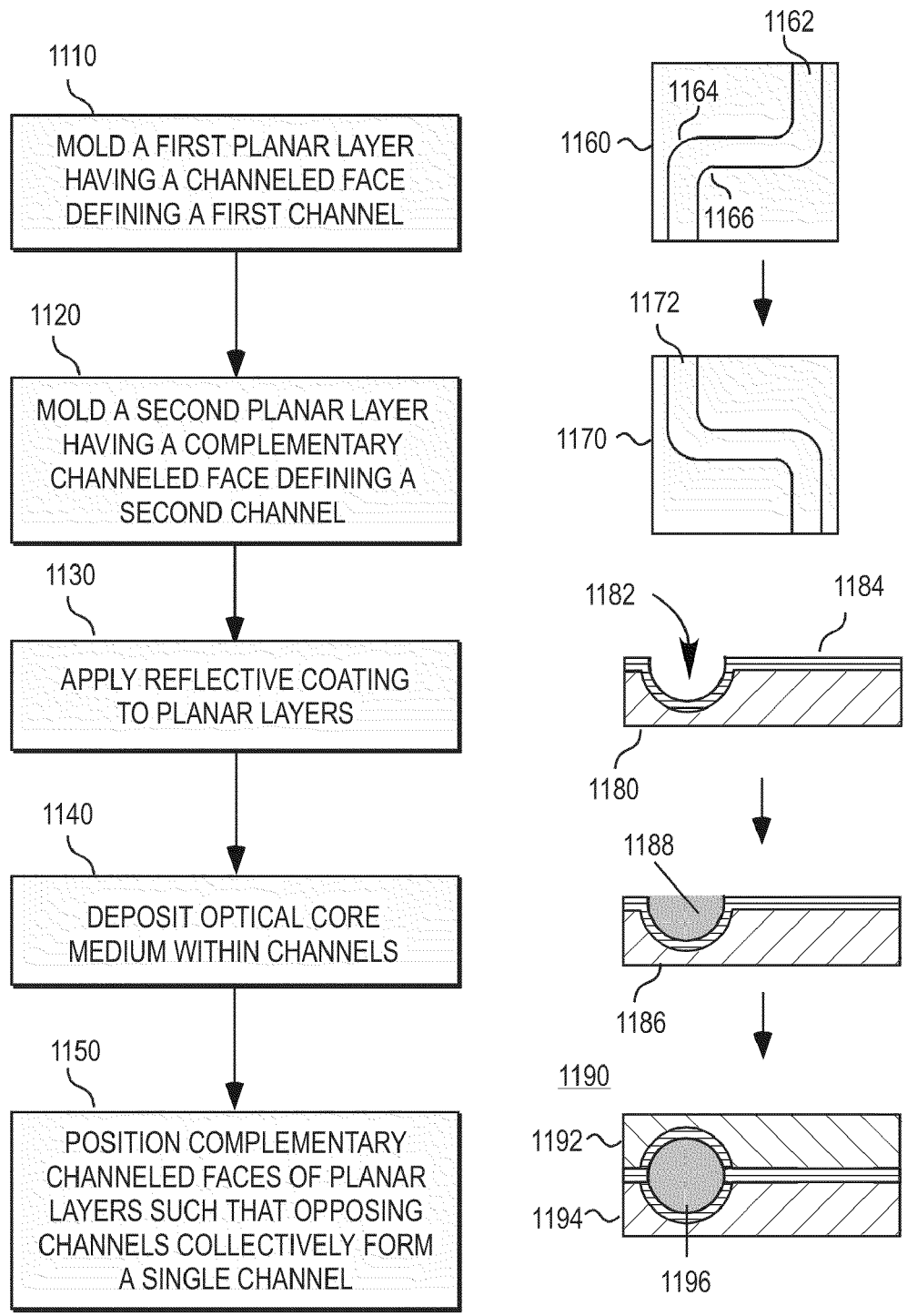
FIG. 11 illustrates another embodiment of a method of forming an optical path with a composite channel.

FIG. 11 illustrates an alternative embodiment of forming an optical path within planar layers having complementary channels. A first planar layer 1160 having a channeled face defining a first channel is provided. In one embodiment, the channeled planar layer is molded. In one embodiment, the inside 1166 and outside 1164 turns of the channel 1162 are curved. In one embodiment, the first channel has a semicircular cross section.

A second planar layer having a complementary channeled face defining a second channel is provided in step 1120. In particular, the channel 1172 of the second planar layer 1170 is complementary to the channel 1162 of the first planar layer 1160. When the first and second channeled faces are face-up, the routes followed by the respective channels are mirror images of each other. The second planar layer may similarly be molded.

A reflective coating 1184 is applied to the planar layers 1180 in step 1130. As indicated by the cross-section of a planar layer 1180, the channel 1182 has a semi-circular cross-section.

In one embodiment, an optical core medium 1188 is deposited within the channels of the first and second planar layers 1186 in step 1140. The complementary channeled faces of the planar layers 1192, 1194 are disposed such that opposing channels collectively form a single channel. As indicated with respect to stack 1190, the first planar layer 1192 and second planar layer 1194 are positioned such that the complementary channeled faces oppose each other. The first and second channels collectively form a larger composite channel 1196. In one embodiment, the composite channel 1196 has a circular cross-section.

In various embodiments, the optical core medium may be deposited by injecting the optical core medium into the larger channel after the first and second planar layers have been stacked such that the complementary channeled faces oppose each other. In one embodiment, the step of depositing the optical core medium is omitted. The core may not be required for relatively short distances.

In one embodiment, the reflective material or cladding of an optical path is an electrically conductive material. Metals (e.g., silver, aluminum, gold), certain polymers, and semiconductors are examples of electrically conductive cladding materials. A conductive cladding may be used to provide power, ground, or electrical signals to components connected to the associated optical path. Power or other electrical signals appearing on the cladding or reflective layer will not interfere with any optical signals communicated along the optical path.

Generally, vias may still be used to connect different optical paths as long as there is no conductive material within the via providing an electrically conductive path between the different optical paths. If the electrically conductive cladding or layers of optical paths connected by a via all carry the same electrical component (e.g., power, a selected signal, or ground), then the via may provide electrical conduction between such optical paths.

Various methods and apparatus for forming an optical path within a planar layer have been described. Although prefabricated optical fibers may be inserted into a planar layer such as a printed circuit board, forming the optical path within the layer enables more complex routing. In addition, inserting pre-fabricated optical fibers into a planar layer may be impractical or impossible on a small feature scale such as that associated with integrated circuits. In such a case, forming the optical path within the planar layer may be the only feasible solution.

Figure 12:
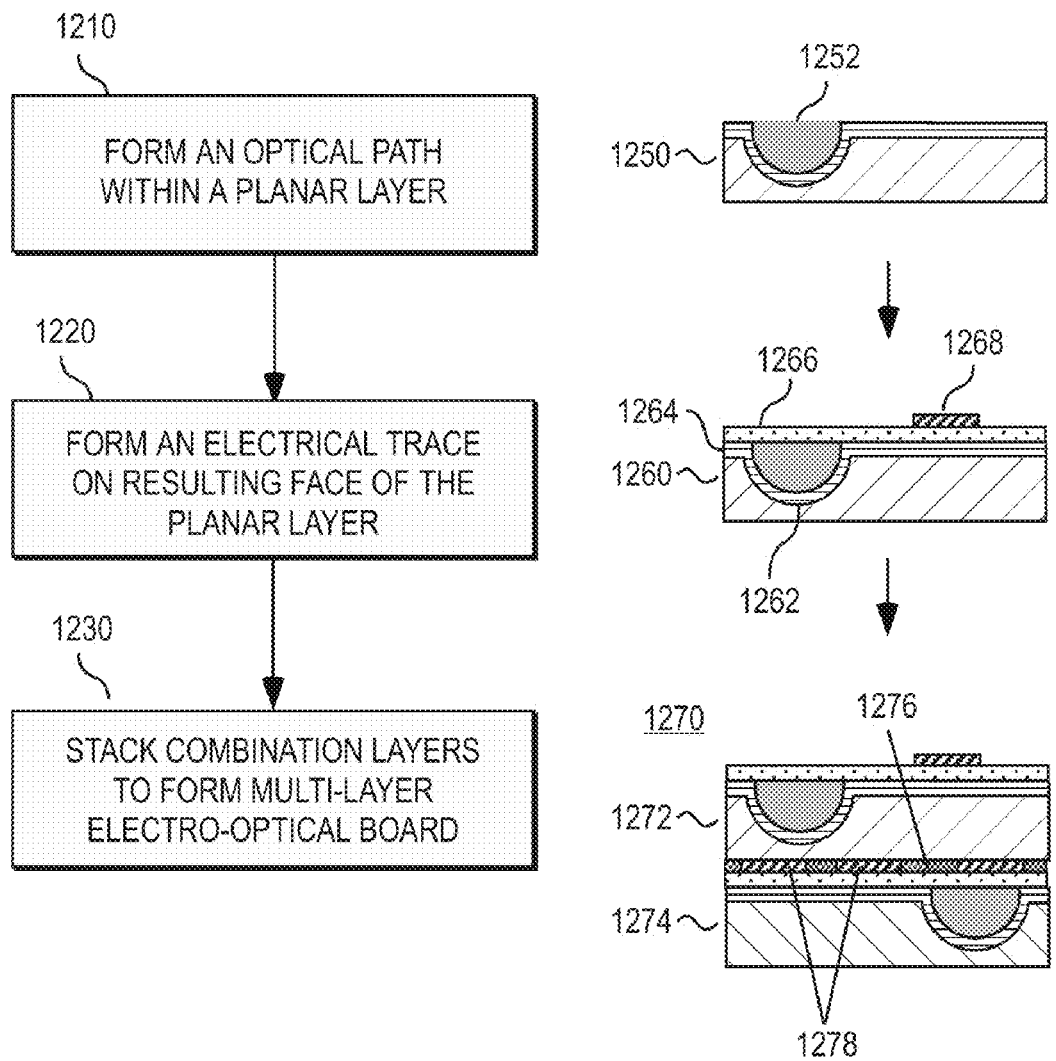
FIG. 12 illustrates one embodiment of a method of forming an electro-optical layer having electrical and optical paths.

The optical paths may be combined with traditional conductive traces to permit electrical and optical signaling on the same planar layer. Referring to FIG. 12, the optical path is formed within the planar layer in step 1210. A conductive electrical trace may be formed on a resulting face of the planar layer in step 1220.

The term "resulting face" is intended to describe a side of the planar layer material after the step of forming the optical path. One resulting face of the planar layer material may be entirely unaffected. Another resulting face may be channeled and have photoresist, reflective coatings, or other material covering the planar layer surface. In the event the optical path was formed using a composite channel, the exposed resulting faces of the layer structure may be unaffected.

In one embodiment, an electrical trace 1268 is formed on the same resulting face or side of the planar layer 1260 as an optical path channel 1262. In another embodiment, the electrical trace is formed on an opposing resulting face from that of the channeled face of the planar layer. The area that the electrical trace is formed on should be non-conductive. Thus if the resulting face of the planar layer has an electrically conductive reflective coating 1264, an insulator layer 1266 is deposited before a conductive electrical trace 1268 is formed to ensure that conduction is confined to the electrical path defined by the trace.

The conductive electrical trace may be formed using a lithographic process. The electrical trace may be formed, for example, by etching a copper-clad fibrous epoxy planar layer or depositing copper on a resulting face of a non-conductive planar layer. In one embodiment, the planar layer is a semiconductor substrate and the electrical trace comprises a metallic or conductive semiconductor material. The resulting planar layer 1260 may be referred to as a combination layer or an electro-optical layer.

In step 1230, the combination layer 1272 may be stacked with other combination layers 1274 to form a multi-layer electro-optical board 1270. An adhesive layer 1276 may be applied to provide support as well as to hold the stack together. The adhesive provides additional support so that the electrical traces 1278 are not the sole means of support between stacked layers. Electrical vias for coupling electrical traces residing within different layers of the electro-optical board may be provided through processes well known in the art.

Figure 13:
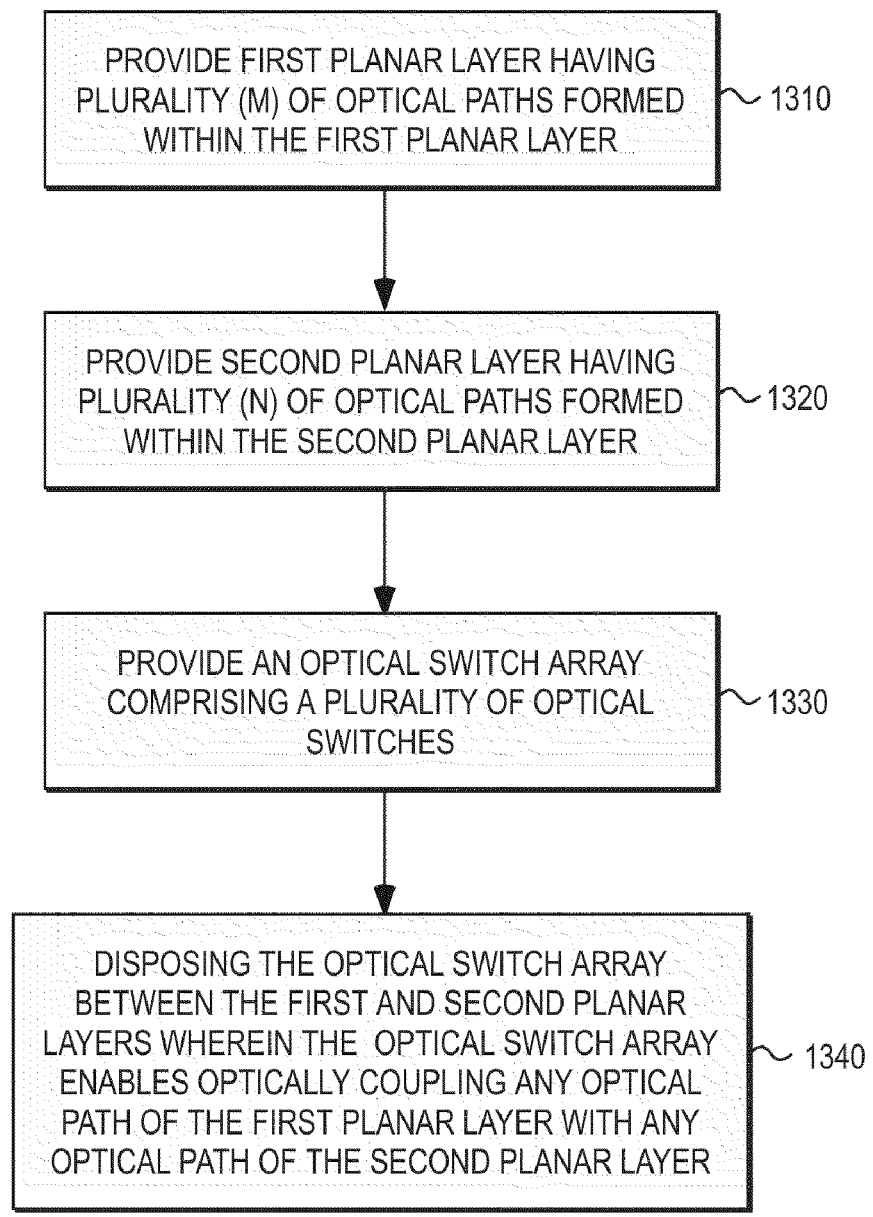
FIG. 13 illustrates one embodiment of a method of forming an optical cross connect.
Figure 14:
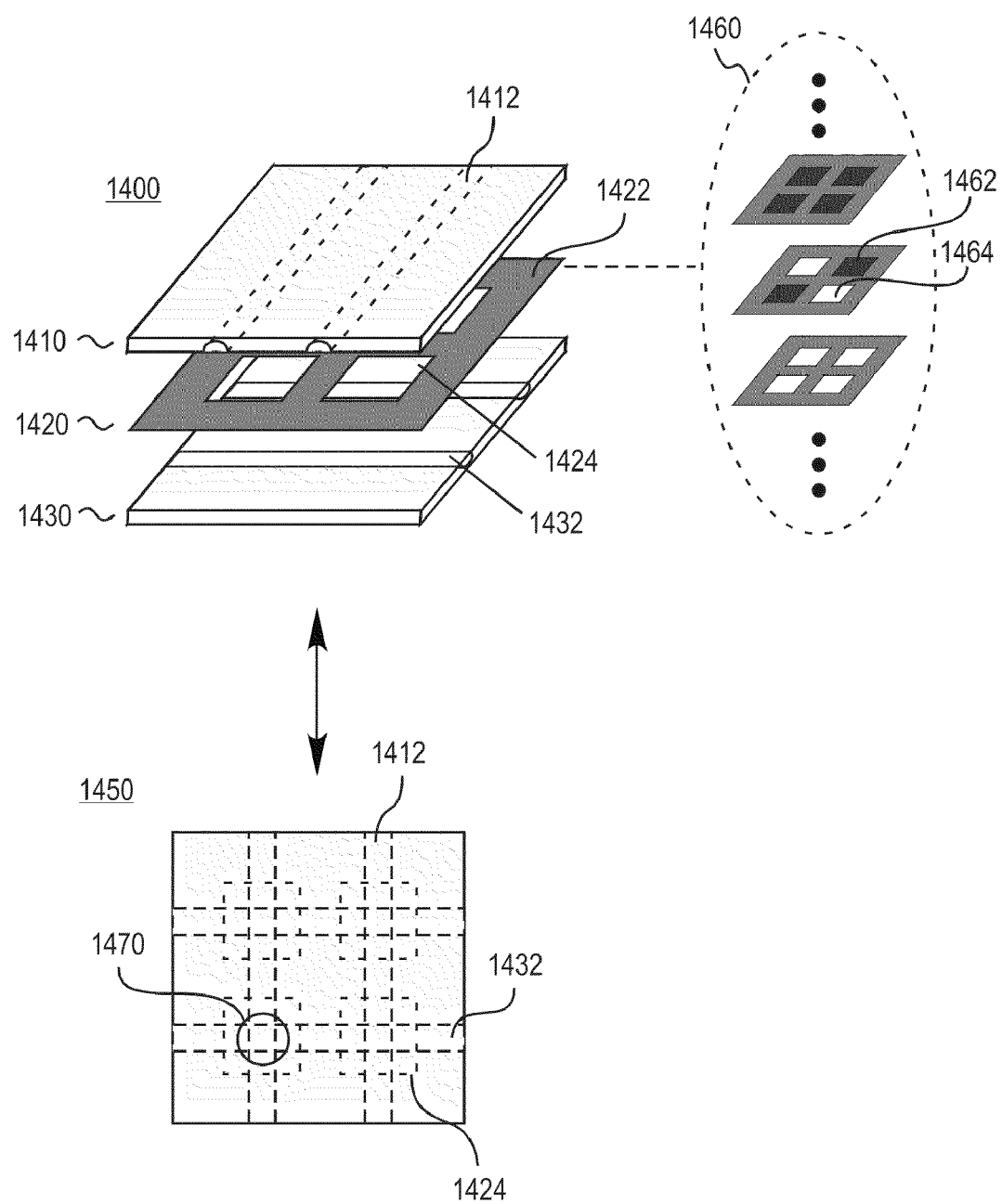
FIG. 14 illustrates one embodiment of an optical cross connect for selectively coupling otherwise distinct optical paths.

FIG. 13 illustrates a method of constructing an optical cross-connect that may be fabricated using the planar layer optical paths. FIG. 14 illustrates one embodiment of an optical cross-connect.

A cross-connect generally permits coupling any one of a set of n points to any one of a set of m points for completing a communication path between the selected points. The cross-connect embodiment illustrated in FIG. 14 is a 2×2 cross-connect (i.e., m, n=2) but may be expanded to accommodate any values of m and n.

Referring to FIG. 13, one method of constructing an optical cross connect includes the step 1310 of providing a first planar layer having a plurality (m) of optical paths formed within the first planar layer. A second planar layer having a plurality (n) of optical paths formed within the second planar layer is provided in step 1320. An optical switch array comprising a plurality of optical switches is provided in step 1330.

In step 1340, the optical switch array is disposed between the first and second planar layers. The first and second planar layers and the switches of the optical switch array are positioned so that the optical switches enable optically coupling any optical path of the first planar layer with any optical path of the second planar layer.

FIG. 14 illustrates one embodiment of an optical cross connect 1400. A first planar layer 1410 has m distinct optical paths such as optical path 1412. A second planar layer 1430 has n distinct optical paths such as optical path 1432. The topology of the optical paths on the planar layers and the disposition of the planar layers relative to each other are selected to ensure that every path in one layer "crosses" every path in the other layer thus forming an array of crossing points such as crossing point 1470 illustrated in top view 1450.

Cross-connect 1400 includes an optical switch array 1420 disposed between the first and second planar layers. The optical switch array comprises a plurality of optical switches such as optical switch 1424 arranged to control transmission of optical signals at the crossing points. Aside from the optical switches, the remainder 1422 of layer 1420 is substantially opaque to prevent optical coupling between layers except at the crossing points.

The optical switches may be individually turned on or off providing for $2^{m \cdot n}$ states, some of which are indicated by callout 1460. In one embodiment, the optical switch array is a liquid crystal optical switch array. Control signals communicated on electrical connections (not illustrated) to the switches determine whether each switch has a transparent 1464 or an opaque 1462 state. In the transparent state, an optical switch permits an optical signal to pass through the switch. In the opaque state, an optical switch substantially eliminates prevents passage of an optical signal through the switch. If necessary, the optical paths in the planar layers may be optically coupled to the optical switch array at the crossing points using vias.

In the preceding detailed description, the invention is described with reference to specific exemplary embodiments thereof. Methods and apparatus for forming and coupling optical paths within one or more planar layers of a board have been described. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of forming optical paths, comprising:
   a) creating a first channel within a first planar layer in a first substrate of a multi-layered printed circuit board (PCB) and a second channel within a second planar layer in a second substrate of the multi-layered PCB, the first and second substrates each having a resulting face and an opposing face, the resulting face of the first substrate including a face of the first planar layer, and the resulting face of the second substrate including a face of the second planar layer;
   b) forming at least a portion of a first optical path within the first channel and forming at least a portion of a second optical path within the second channel;
   c) after forming the portions of the first and second optical paths, forming conductive traces on the resulting face of the first substrate and on the resulting face of the second substrate;
   d) optically coupling with a switch the first channel in the first substrate with the second channel in the second substrate, wherein the first optical path and the conductive traces of the first substrate and the second optical path and the conductive traces of the second substrate permit both electrical and optical signaling in a same planar layer; and
   e) after forming the conductive traces, stacking the first and second substrates such that the resulting face of the first substrate is adjacent to the opposing face of the second substrate.

2. The method of claim 1 wherein step a) further comprises creating the first and second channels using a selected one of a chemical, mechanical, and a thermal process to remove planar layer material.

3. The method of claim 1 wherein step a) comprises molding the planar layer of the first substrate with the first channel and molding the planar layer of the second substrate with the second channel.

4. The method of claim 1 wherein step a) further comprises:
   i) lithographically defining a location of the first optical path on the resulting face of the first substrate and a location of the second optical path on the resulting face of the second substrate; and
   ii) etching the defined locations of the first and second optical paths to create the first and second channels.

5. The method of claim 1 wherein step b) further comprises filling the first and second channels with an optical core medium.

6. The method of claim 1 wherein step b) further comprises:
   i. depositing a first cladding portion within the first and second channels;
   ii. depositing an optical core medium within the first and second channels; and
   iii. depositing a second cladding portion over the optical core medium.

7. The method of claim 1 further comprising:
   e) switching the switch between an opaque state that prevents passage of an optical signal and a transparent state that permits passage of the optical signal.

8. The method of claim 1 wherein the first planar layer and the second planar layer are each a selected one of a conductor, nonconductor, and semiconductor layer.

9. The method of claim 1 wherein walls of the first and second channels have a lower index of refraction than that of the optical core medium.

10. The method of claim 1 wherein the first and second optical paths are substantially non-cylindrical.

11. A method of forming an optical path, comprising:
    providing a first substrate with a first planar layer having a channeled face defining a first channel formed in the first substrate;
    forming conductive traces on the channeled face;
    providing a second substrate with a second planar layer having a complementary channeled face defining a second channel formed in the second substrate;
    placing the first and second planar layers such that the first and second channels oppose each other to form a composite channel defining the optical path in a multi-layered printed circuit board and such that the conductive traces on the channeled face are adjacent to the complementary channeled face; and
    providing vias through the first and second planar layers to connect the composite channel with different optical pathways extending through different vertically stacked layers of the multi-layered printed circuit board.

12. The method of claim 11 further comprising applying a reflective mirroring coating to the first and second planar layers.

13. The method of claim 12 wherein the reflective mirroring coating applied to the first and second planar layers is an electrically conductive material and is electrically connected to at least one component connected to the optical path.

14. The method of claim 11 further comprising depositing an optical core medium within the first and second channels.

15. The method of claim 11 further comprising filling the composite channel with an optical core medium.

16. The method of claim 11 further comprising applying a reflective mirroring coating over the first and second channels.

17. The method of claim 16 wherein the reflective mirroring coating applied to the first and second channels is an electrically conductive material and is electrically connected to at least one component connected to the optical path.

18. The method of claim 11 wherein the first and second channels have a semi-circular cross-section.

19. The method of claim 11 wherein one of the first and second planar layers is molded with its respective channel.

* * * * *